(12) United States Patent
Silsby

(10) Patent No.: US 7,586,076 B2
(45) Date of Patent: Sep. 8, 2009

(54) IMAGE SENSOR DEVICE HAVING ONE OR MORE MODIFIED DUMMY PIXELS THAT ARE USABLE AS NON-VOLATILE MEMORY ELEMENTS

(75) Inventor: Christopher Dean Silsby, Albany, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 190 days.

(21) Appl. No.: 11/533,816

(22) Filed: Sep. 21, 2006

(65) Prior Publication Data

US 2008/0073488 A1 Mar. 27, 2008

(51) Int. Cl.
*H01L 27/00* (2006.01)

(52) U.S. Cl. ............... 250/208.1; 250/214.1; 348/245; 348/247; 348/308

(58) Field of Classification Search ............. 250/208.1, 250/214.1; 348/222.1, 245–247, 308
See application file for complete search history.

(56) References Cited

U.S. PATENT DOCUMENTS 7,141,774 B2 * 11/2006 Yuyama .................. 250/208.1

2002/0136050 A1 9/2002 Fang
2002/0163491 A1 * 11/2002 Yoshimura et al. ............ 345/90
2003/0085402 A1 5/2003 Tay
2004/0262495 A1 12/2004 Yuyama

OTHER PUBLICATIONS

International Search Report, Appln. No. PCT/US2007/020250 dated Jan. 25, 2008.

* cited by examiner

*Primary Examiner*—Kevin Pyo
(74) *Attorney, Agent, or Firm*—RatnerPrestia

(57) ABSTRACT

One or more dummy pixels of an image sensor device IC are modified to include programming circuitry that enables them to be used as non-volatile memory. Dummy pixels are non-imaging pixels that already exist in image sensor ICs and are addressable using the same circuitry that is used to address the imaging array of the IC. Therefore, there are no additional processing steps and no additional cost associated with implementing the dummy pixels or circuitry for addressing the dummy pixels in the IC. One or more of these non-imaging dummy pixels are modified to make the dummy pixels programmable to enable the pixels to store logic 1 bits and logic 0 bits.

14 Claims, 5 Drawing Sheets

IMAGE SENSOR DEVICE HAVING ONE OR MORE MODIFIED DUMMY PIXELS THAT ARE USABLE AS NON-VOLATILE MEMORY ELEMENTS

TECHNICAL FIELD OF THE INVENTION

The invention relates to photodiode devices formed in integrated circuits (ICs). More particularly, the invention relates to using dummy pixels as non-volatile memory in an image sensor device IC.

BACKGROUND OF THE INVENTION

Non-volatile memory is becoming increasingly costly for a variety of reasons. Increases in the complexity of advanced complementary metal oxide semiconductor (CMOS) processes, as well as increases in the cost of reticles used in these processes, have made non-volatile memory more costly. In addition, an increased demand for non-volatile memory in recent years has made non-volatile memory more costly. In particular, in the CMOS imaging industry, attempts to satisfy customer demand for features that require increased amounts of non-volatile memory has increased the overall demand for non-volatile memory. Such features include, for example, excellently calibrated image quality, colors, and die tracking.

An image sensor device is an integrated circuits (IC) having an array of pixels and circuitry for sampling the pixels and processing the pixel sample values. Pixel dimensions in image sensor devices are continually decreasing. At the same time, efforts are continually being made to increase the photodiode area of the pixels. The processing of the pixel sample values typically occurs, at least in part, in an image processing pipeline of the image sensor IC. The image processing pipeline uses non-volatile memory to calibrate against manufacturing variations, load new code, and other various functions that increase flexibility, yield, and usability of the end product. It is desirable for the non-volatile memory used for this purpose to be embedded in the image sensor IC, and to consume as little space as possible so that more space is available for the photodiode diodes.

Because of the aforementioned increased costs associated with non-volatile memory and the desire to include non-volatile memory on image sensor ICs, a need exists for a way to reduce the costs associated with implementing non-volatile memory in image sensor ICs. A need also exists for a way to implement non-volatile memory in image sensor ICs that is efficient in terms of space utilization.

SUMMARY OF THE INVENTION

The invention provides an image sensor device having one or more pixels that are usable as one or more respective non-volatile memory elements, and a method for using one or more non-imaging pixels of an image sensor device as one or more respective non-volatile memory elements. The image sensor device is formed in an integrated circuit (IC) and comprises an imaging array of imaging pixels, each of which includes one or more transistors and a photodiode device, and at least one non-imaging pixel configured to function as a non-volatile memory element that stores one or more digital bits of data.

The method comprises selecting at least one non-imaging pixel of an image sensor device to be used as at least one respective memory element, and storing one or more digital bits in the at least one selected non-imaging pixel.

These and other features and advantages of the invention will become apparent from the following description, drawings and claims.

DETAILED DESCRIPTION OF EXEMPLARY EMBODIMENTS

In accordance with the invention, one or more dummy pixels in an image sensor IC are modified to include programming circuitry that enables them to be used as non-volatile memory. Dummy pixels are non-imaging pixels that already exist in image sensor ICs and are addressable using the same circuitry that is used to address the imaging array of the IC. Therefore, there are no additional processing steps and no additional cost associated with implementing the dummy pixels or circuitry for addressing the dummy pixels in the IC. One or more of these non-imaging dummy pixels are modified to make the dummy pixels programmable to enable the pixels to store logic 1 bits and logic 0 bits.

Figure 1:
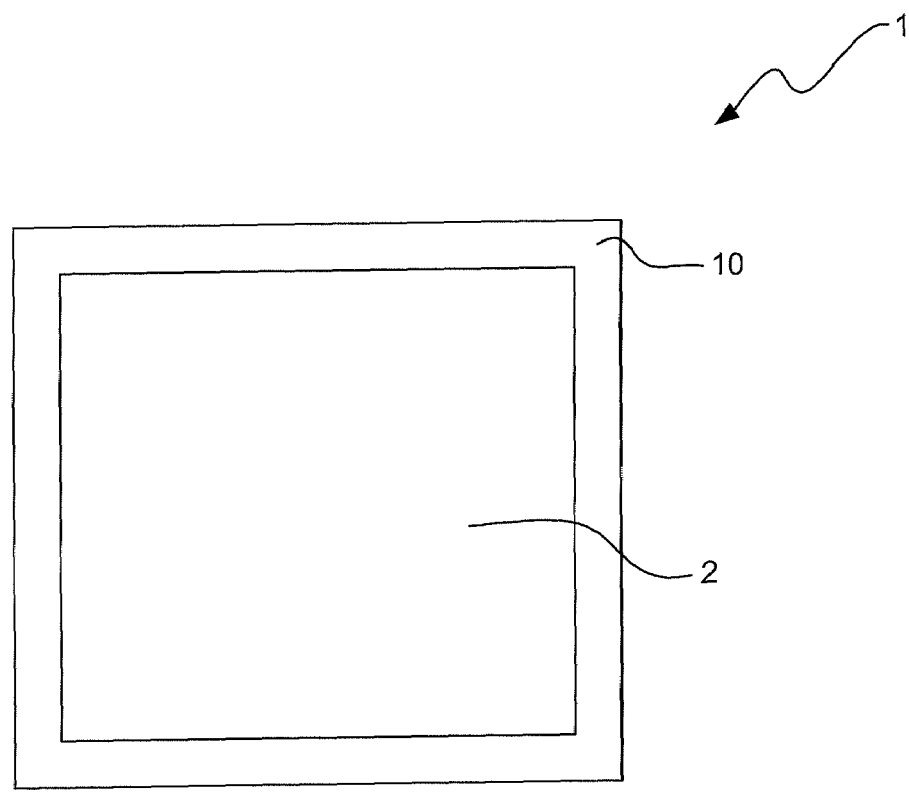
FIG. 1 illustrates a plan view of a pixel array of an image sensor IC.

FIG. 1 illustrates a plan view of a pixel array 1 of an image sensor IC. The pixel array 1 includes pixels 2 that form the imaging array as well as dummy pixels 10 that surround the imaging array 2. The dummy pixels 10 typically serve only the function of providing a buffer region for the pixels of the imaging array 2. In CMOS image sensor ICs, the dummy pixels surround the imaging array, but in other types of image sensor ICs made using other fabrication processes, dummy pixels may be located in other areas relative to the imaging array pixels. The invention is not limited with respect to the locations of the dummy pixels that are used to achieve the objectives of the invention or with respect to the type of process that is used to make the image sensor IC.

Figure 2:
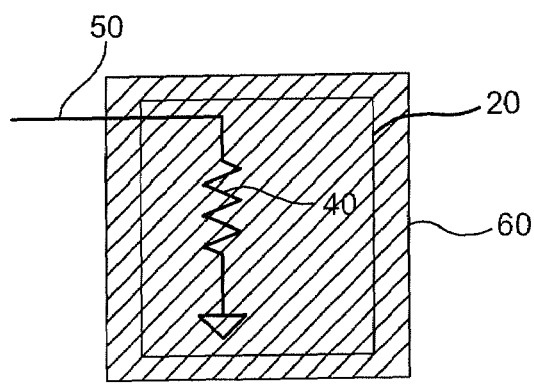
FIG. 2 illustrates a top view of a dummy pixel in accordance with one exemplary embodiment of the invention having programming circuitry for programming bits into the pixel.

As stated above, the dummy pixels 10 are modified to include programming circuitry for programming the pixels 10. The programming circuitry that is used for this purpose can be configured in different ways depending the desired implementation technique to be used. FIG. 2 illustrates a top view of a dummy pixel 20 in accordance with an exemplary embodiment of the invention having programming circuitry for programming bits into the pixel 20. In accordance with this embodiment, the programming circuitry includes a resistive element 40 connected on one end to ground, GND, and a conductor 50 that is connected to the other end of the resistive element 40 for supplying an electrical current to the resistive element 40.

When electrical current is supplied via conductor 50 to the resistive element 40, the resistive element 40 increases in temperature. A film 60 above the pixel 20 has optical properties that change as the temperature of the film changes. When current is not being provided to the resistive element 40, the film 60 above the pixel 20 is transparent or translucent to light and allows light through to the photodiode of the pixel 20. This is the unwritten or unprogrammed state of the pixel 20. When current is provided to the resistive element 40, the resistive element 40 increases in temperature and causes the film 60 to partially or wholly block light and prevent light from being incident on the photodiode of the pixel 20. This is the written, or programmed state, of the pixel 20. In the programmed state, the pixel 20 is always dark. The pixel 20 can be read in the normal manner during pixel readout by addressing the pixel 20 using the read circuitry (not shown) that is already available on the image sensor IC. Although the programmed pixel is dark and always outputs a low value when read, the programmed state of the pixel 20 may be a logic 0 or a logic 1 depending on how this low value is processed by logic downstream of the readout circuitry. For example, the non-inverted low value corresponds to a logic 0 whereas the inverted low value corresponds to a logic 1.

Figure 3:
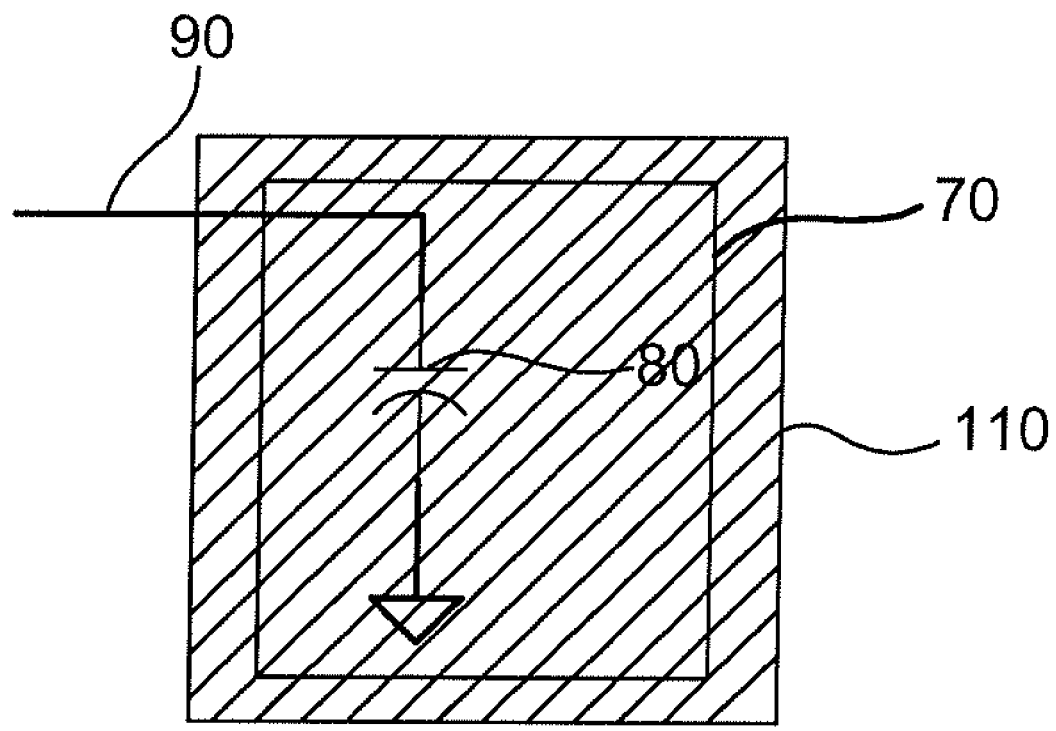
FIG. 3 illustrates a top view of a dummy pixel in accordance with another exemplary embodiment of the invention having programming circuitry for programming bits into the pixel.

FIG. 3 illustrates a top view of a dummy pixel 70 in accordance with an exemplary embodiment of the invention having programming circuitry for programming bits into the pixel 70. In accordance with this embodiment, the programming circuitry includes a capacitive element 80 connected on one end to ground, GND, and a conductor 90 that is connected to the other end of the capacitive element 110 for supplying an electrical current to the capacitive element 80. The capacitive element 80 is typically the parasitic capacitance of a field effect transistor (FET) gate (not shown) of the pixel 70. The pixel 70 is programmed by supplying a large electrical current or voltage to the capacitive element 80 via conductor 90 to damage the capacitive element 80 and cause it to be leaky. Once this has occurred, the pixel output value read out of the pixel 70 during sampling will always be a large value, indicating that the pixel 70 is bright. As with pixel 20 shown in FIG. 2, this programmed state of the pixel 70 may correspond to either a logic 0 or a logic 1 depending on how this low value is processed by logic downstream of the readout circuitry.

Figure 4:
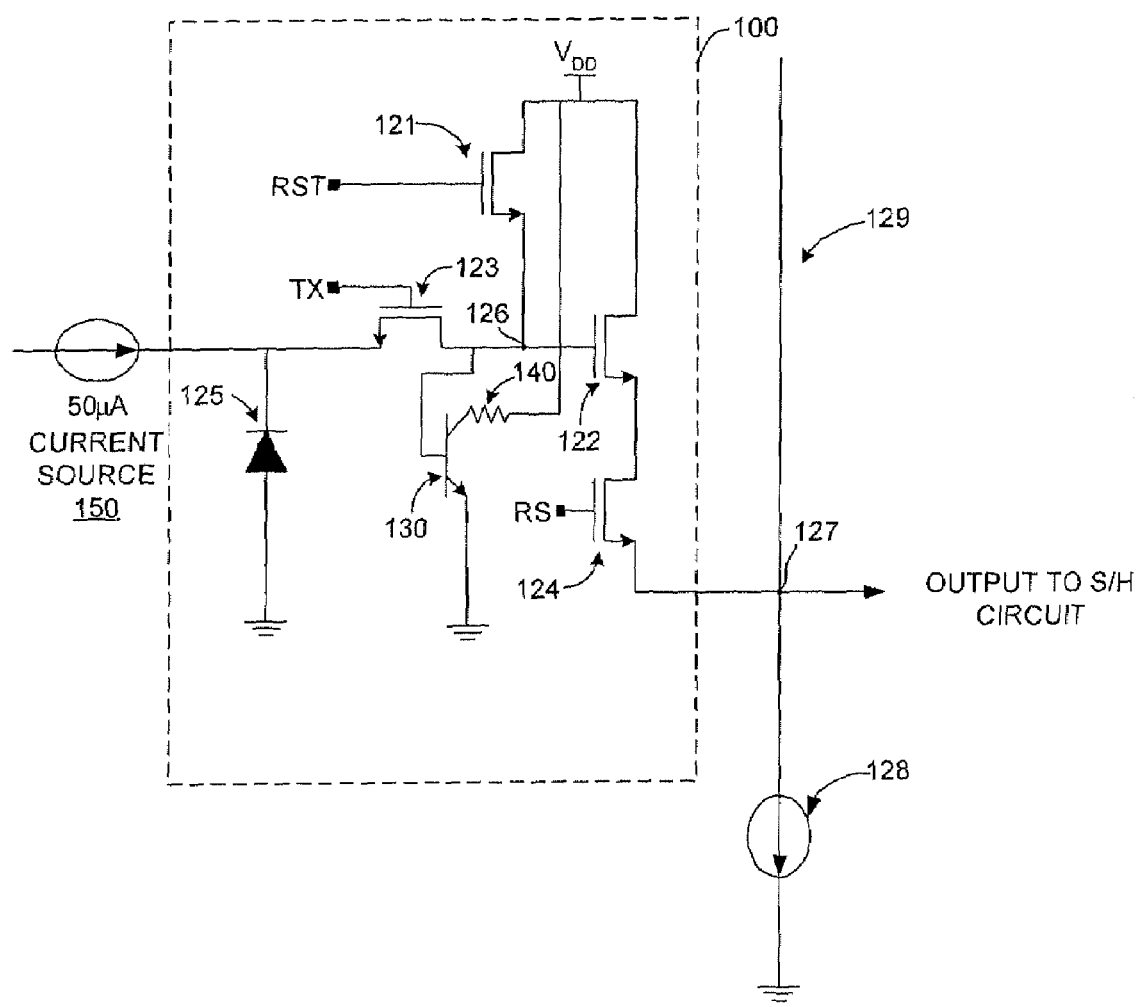
FIG. 4 illustrates a circuit diagram of a 4-T buried-gated pixel that has been modified to include the programming circuitry shown in FIG. 2.

FIG. 4 illustrates a circuit diagram of a known four-transistor (4-T) buried-gated photodiode device (pixel) 100 that has been configured to include the programming circuitry described above with reference to FIG. 2. It should be noted that the invention is not limited to any particular type of pixel technology. The pixel 100 shown in FIG. 4 is merely one example of a pixel that is suitable for use with the invention. An example of another type of pixel that is suitable for use with the invention is a three-transistor (3-T) buried-gated photodiode device (not shown). Those skilled in the art will understand, in view of the examples described herein, the manner in which other types of pixels such as 3-T buried-gated photodiode devices may be configured with programming circuitry in accordance with the invention to enable them to be used as memory elements.

The pixel 100 includes a reset transistor 121, a source follower (SF) transistor 122, a transfer transistor 123, a row-select transistor 124, and a photodiode 125. The gate of the reset transistor 121 receives a reset signal, RST. The gate of the SF transistor 122 is tied to the FD node 126. The gate of the transfer transistor 123 receives a transfer signal, TX. The gate of the row-select transistor 124 receives a row-select signal, RS. The drain of the RS transistor 124 is tied to the source of the SF transistor 122. The source of the RS transistor 124 is tied to the column output line 129 at output node 127, which includes a current source 128.

The programming circuitry comprises a bipolar junction transistor (BJT) 130, a resistive element 140 and a current source 150, which may be, for example, a 50 microampere ($\mu$A) current source. The current source 150 is external to the pixel 100 and may be used to supply current to a plurality of dummy pixels identical to pixel 100 that are in the same array.

In order to program the pixel 100, the TX signal is asserted, which turns on the transfer transistor 123. This allows current from the current source 150 to flow to the gate of the BJT 130, which turns on the BJT 130, thereby allowing current to flow through the resistive element 140. As described above with reference to FIG. 3, when current flows through the resistive element 140, it increases in temperature causing the optical properties of a film material (not shown) above the pixel to change such that the film partially or wholly blocks light. This prevents light from being incident on the photodiode 125 of the pixel 20, or at least reduces the amount of light that is incident on the photodiode 125. Consequently, when the pixel 100 is subsequently read, the circuitry (not shown) downstream of the pixel 100 will determine that the pixel is dark.

The BJT 130 may be a CMOS parasitic BJT having an emitter n– region, a base p– region and a collector n+ region. Each of the MOSFET transistors 121-124 has such a parasitic BJT that results during the CMOS fabrication process. The parasitic BJT that is part of the transfer transistor 123 may therefore be used for this purpose, or a separate gate may be formed in the pixel for this purpose.

A variety of film materials are available that change their optical properties when heated. Those skilled in the art will understand how to select a suitable material for use with the invention. It should also be noted that while the embodiment described above uses a film material that transmits less or no light when heated, other films may be used that are opaque when in an unheated state and become more transmissive to light when heated. In the latter case, the pixel will be dark in the unwritten or unprogrammed state, and bright in the written or programmed state.

The pixel 100 is read in the normal manner, as will now be described. When the RS signal is asserted, the row-select transistor 124 is turned on and the pixel 100 is ready to be read. During the rest-sampling phase of the read cycle, the RST signal is asserted. The TX signal is deasserted at this time. The FD node 126 is connected to the supply voltage $V_{DD}$, which turns on the SF transistor 122 and causes a buffered voltage corresponding to the voltage on the FD node 126 to be driven onto the analog column readout line 129. This voltage, which corresponds to the reset sampling value, is then stored on a reset storage capacitor (not shown) of a sample-and-hold (S/H) circuit (not shown).

During the video-sampling phase of the read cycle, the RST signal is deasserted and the TX signal is asserted. Assertion of the TX signal turns on the transfer transistor 123, connecting the photodiode 125 to the FD node 126. The charge that previously integrated onto the photodiode 125 is transferred to the FD node 126. The SF transistor 122 is turned on and the voltage on the FD node 126, which corresponds to the video sampling value, is output onto the analog column readout line 129 and subsequently stored on a video storage capacitor (not shown) of the S/H circuit (not shown). Circuitry (not shown) of the image sensor device downstream of the S/H circuit takes the difference between the video and reset sampling values and this difference value corresponds to the brightness level of the pixel 100. In the written state, when a film material is used that blocks light when heated, this difference value will be very small indicating that the pixel is dark.

It is possible for the pixel 100 to perform its memory functions even without the photodiode 125. The FD node 126 is sensitive to light, and the amount of charge that is stored on the FD node 126 will vary in accordance with the amount of light that is incident on the FD node 126. Thus, when the film blocks light, the amount of charge that is on the FD node 126 will decrease. Consequently, when the pixel 100 is read, the pixel 100 will be interpreted by downstream circuitry as being a dark pixel.

Figure 5:
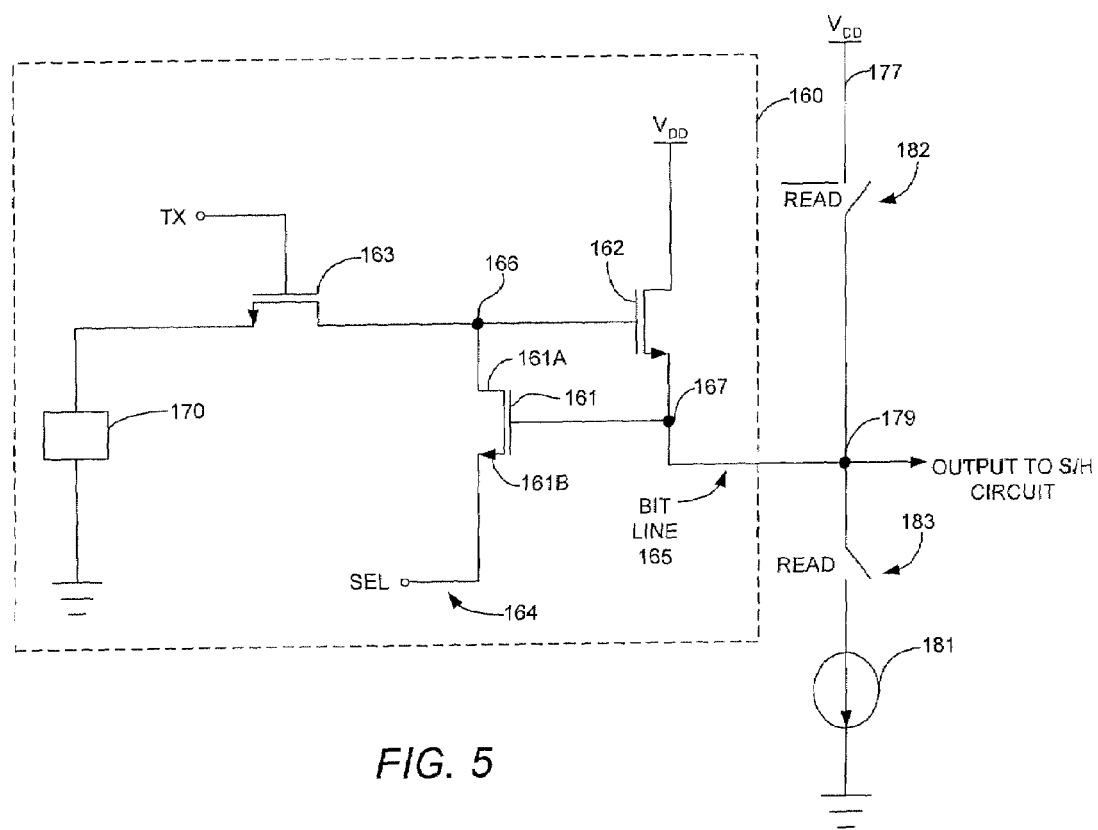
FIG. 5 illustrates a circuit diagram of a 3-T buried-gated pixel that has been modified to include the programming circuitry shown in FIG. 3.

FIG. 5 illustrates a circuit diagram of a 3-T buried-gated photodiode device (pixel) 160 that includes the programming circuitry shown in FIG. 3. As stated above, the invention is not limited to any particular type of pixel technology. The pixel 160 shown in FIG. 5 is merely another example of a pixel that is suitable for use with the invention. For example, the 4-T pixel 100 shown in FIG. 4 may be configured in accordance with the invention to include the programming circuitry shown in FIG. 3.

The pixel 160 includes a reset transistor 161, a SF transistor 162, a transfer transistor 163, and a capacitive element 170. The gate of the reset transistor 161 is connected to the source of the SF transistor 162 at node 167, which is connected to the pixel output node 179 of the analog column readout line 177. The analog column readout line 177 includes a current source 181. The source 161A of the reset transistor 161 is connected to a select (SEL) signal. The drain 161B of the reset transistor 161 is connected to the FD node 166. The drain of the SF transistor 162 is connected to $V_{DD}$.

Because the pixel 160 is a dummy pixel that is being used as a memory element rather than as an imaging pixel of an imaging array, the capacitive element 170 may be located at the location at which a photodiode would normally be located if the pixel 160 were being used as an imaging pixel. The capacitive element 170 is capable of storing charge, but becomes leaky when a relatively large current or voltage is applied to it. The capacitive element 170 is typically an n+ island region that is capable of storing charge, and that has a thin gate that breaks down when a large voltage is applied to it such that the element 170 becomes permanently leaky. The capacitive element 170 may instead be a p+ island region. Those skilled in the art will understand the manner in which such island regions are formed in the image sensor device for this purpose.

The pixel 160 is programmed by asserting the TX signal to turn on the transfer transistor 163, closing the READ bar switch 182 (opening the READ switch 183) and applying a relatively large programming voltage differential across the SEL signal line and the bit line 165. The application of the programming voltage damages the capacitive element 170 as described above causing it to permanently leak charge. Thus, once programmed, the element 170 becomes a charge leakage element. The capacitive element 170 loses charge in a similar way that the amount of charge on a photodiode reduces in response to light being incident on the photodiode. The leaked charge integrates onto the FD node 166. Consequently, the pixel 160 will always be read as a bright pixel after it has been programmed.

The manner in which the dummy pixel 160 is read is as follows. During the rest-sampling phase of the read cycle, the SEL signal is asserted and the READ bar switch 182 is closed (READ switch 183 is opened) connecting the gate of the reset transistor 161 to $V_{DD}$. The TX signal is deasserted at this time. The FD node 166 is connected to the SEL signal line, which turns on the SF transistor 162 and causes a buffered voltage corresponding to the voltage on the FD node 166 to be driven onto the line 177. This voltage, which corresponds to the reset sampling value, is then stored on a reset storage capacitor (not shown) of a sample-and-hold (S/H) circuit (not shown).

During the video-sampling phase of the read cycle, the SEL signal is deasserted, the TX signal is asserted and the READ switch 183 is closed (READ bar switch 182 is opened). Assertion of the TX signal turns on the transfer transistor 163, connecting the capacitive element 170 to the FD node 166. The charge that was previously stored on the capacitive element 170 is transferred to the FD node 166. The SF transistor 162 is turned on and the voltage on the FD node 166, which corresponds to the video sampling value, is output onto the readout line 177 and subsequently stored on a video storage capacitor (not shown) of the S/H circuit (not shown). Circuitry (not shown) of the image sensor device downstream of the S/H circuit takes the difference between the video and reset sampling values and this difference value corresponds to the brightness level of the pixel 160.

In the written or programmed state, the result of the charge leaking off of the element 170 is that the difference between the reset and video sampling values is always a large value. Consequently, circuitry downstream of the S/H circuit will interpret this difference value as corresponding to a bright pixel. Therefore, in the written state, the pixel 160 is a bright pixel.

By controlling the extent of the damage to the capacitive element 170, the amount of charge that is leaked by the element 170 can also be controlled. The extent of the damage to the element 170 can be varied by varying the magnitude of the SEL voltage or current signal applied to the element 170 during programming of the pixel 160. Varying the amount of leakage allows the number of bits that is stored by the pixel 160 to be varied. For example, a small amount of damage resulting in a small amount of leakage produces a difference value that is interpreted downstream as corresponding to a low level of brightness (e.g., 001 binary); a slightly larger amount of damage resulting in a slightly larger amount of leakage produces a difference value that is interpreted downstream as corresponding to a medium level of brightness (e.g., 100 binary); a very large amount of damage resulting in a very large amount of leakage produces a difference value that is interpreted downstream as corresponding to a high level of brightness (e.g., 111 binary).

Figure 6:
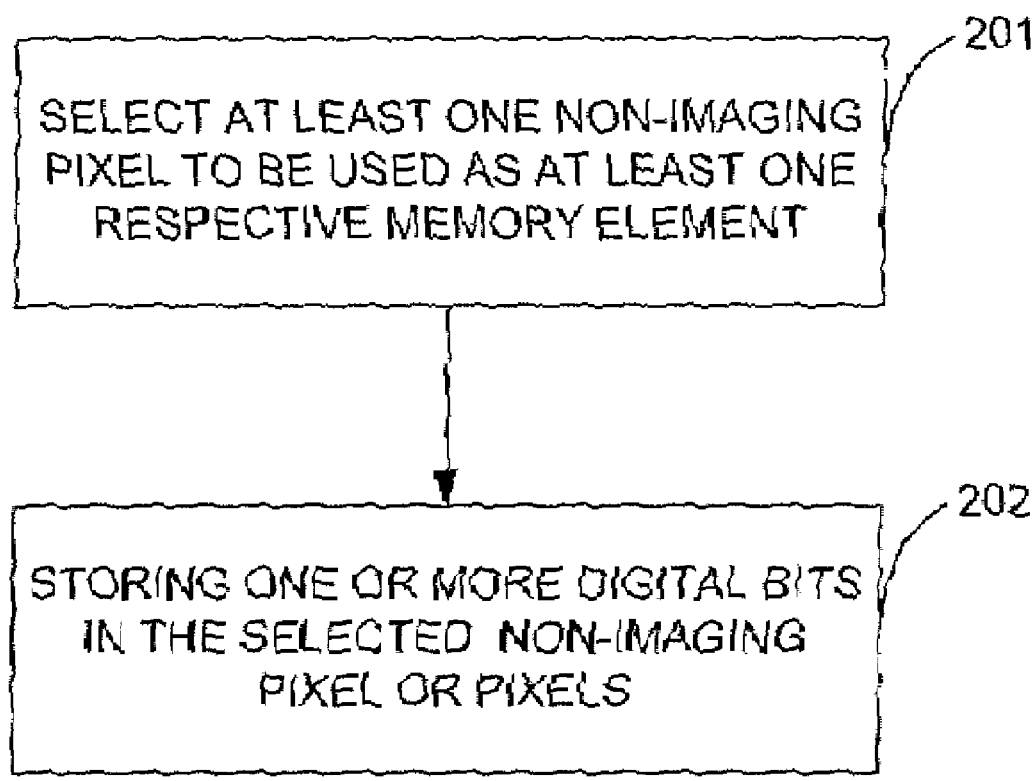
FIG. 6 illustrates a flowchart that represents the method of the invention in accordance with an exemplary embodiment.

FIG. 6 illustrates a flowchart that represents the method of the invention in accordance with an exemplary embodiment for using one or more non-imaging pixels of an image sensor device as one or more respective non-volatile memory elements. At least one non-imaging pixel of an image sensor device is selected for use as at least one respective memory element, as indicated by block 201. The selection process typically depends on the number of dummy pixels available and the amount of memory needed. One or more digital bits are then stored in the selected non-imaging pixel or pixels, as indicated by block 202. The storage of the bits is performed in the manner described above using programming circuitry such as that shown in FIGS. 2 and 3, for example.

It should be noted that the invention has been described herein with reference to exemplary embodiments and that the invention is not limited to the embodiments described herein. For example, the modifications to the pixels 100 and 160 shown in FIGS. 4 and 5 are only examples of two ways in which pixels may be suitably modified to achieve the goals of the invention. Those skilled in the art will understand, in view of the description provided herein, the manner in which other modifications may be made to pixels to achieve the same goals, and that all such modifications are within the scope of the invention.

What is claimed is:

1. An image sensor device formed in an integrated circuit (IC) comprising:
   an imaging array of imaging pixels, each imaging pixel including one or more transistors and a photodiode device;
   at least one non-imaging pixel configured to function as a non-volatile memory element that stores one or more digital bits of data; and
   programming circuitry configured to adjust a temperature of the at least one non-imaging pixel in order to store the one or more digital bits of data in the at least one non-imaging pixel.

2. The image sensor device of claim 1, wherein the configuration of said at least one non-imaging pixel includes one or more programming circuitry elements, said one or more programming circuitry elements being configured to enable said at least one non-imaging pixel to be programmed with said one or more digital bits of data such that if one or more programmed non-imaging pixels is read by read circuitry of the image sensor device, the read circuitry will read said one or more digital bits.

3. The image sensor device of claim 2, further comprising:
   a film material disposed adjacent to or on an external surface of the non-imaging pixels, the film material having at least one optical property that changes as a function of temperature, wherein said one or more programming circuitry elements of each non-imaging pixel includes at least one resistive element that receives electrical current supplied from a current source of the programming circuitry, the current source being external to said one or more non-imaging pixels, wherein each non-imaging pixel is programmable by supplying electrical current from the current source to the resistive element of the non-imaging pixel being programmed, wherein when a non-imaging pixel receives electrical current from the current source, the resistive element increases in temperature causing the film material disposed adjacent to or on the external surface of the non-imaging pixel to increase in temperature such that the film material at least partially blocks light from passing into the non-imaging pixel being programmed, and wherein the at least partial blockage of light causes the programmed non-imaging pixel to output a voltage level when read by read circuitry of the image sensor device, the voltage level representing said one or more digital bits stored in the non-imaging pixel.

4. The image sensor device of claim 1, further comprising:
   read circuitry connected to the imaging pixels and to the non-imaging pixels, the read circuitry being configured to address the imaging pixels and the non-imaging pixels and to read sample values output from pixels when the pixels are addressed.

5. The image sensor device of claim 2, wherein said one or more programming circuitry elements further includes a bipolar junction transistor (BJT) having a base, a collector and an emitter, one of the emitter and the collector of the BJT being connected to a first terminal of the resistive element, the base of the BJT receiving electrical current supplied from the current source, one of the emitter and the collector of the BJT being connected to a ground potential, GND, a second terminal of the resistive element being connected to a supply voltage, $V_{DD}$, of the non-imaging pixel, wherein the electrical current is supplied to the base of the BJT during programming on the respective non-imaging pixel causing the BJT to turn on, wherein when the BJT turns on, electrical current flows through the resistive element causing it to heat and increase in temperature.

6. The image sensor device of claim 1, wherein the imaging pixels and said at least one non-imaging pixel are three transistor (3-T) buried-gated photodiode devices.

7. The image sensor device of claim 1, wherein the imaging and non-imaging pixels are four-transistor (4-T) buried-gated photodiode devices.

8. The image sensor device of claim 3, wherein the current source can be switched on and off to switch on and off the electrical current being supplied to the resistive element.

9. The image sensor device of claim 8, wherein the non-imaging pixels do not include photodiodes.

10. The image sensor device of claim 3, wherein each of the non-imaging pixels includes a photodiode device.

11. The image sensor device of claim 1, further comprising a plurality of dummy pixels that surround the imaging array and provide a buffer region for the imaging array, at least one of the non-imaging pixels being a dummy pixel.

12. A method for using one or more non-imaging pixels of an image sensor device as one or more respective non-volatile memory elements, the method comprising:
    selecting at least one non-imaging pixel of an image sensor device to be used as at least one respective memory element; and
    changing a temperature of the at least one non-imaging pixel and thereby storing one or more digital bits in the at least one selected non-imaging pixel.

13. The method of claim 12, wherein the step of storing one or more bits comprises:
    programming the at least one selected non-imaging pixel by supplying an electrical current to a resistive element of the at least one selected non-imaging pixel to cause the resistive element to increase in temperature thereby heating a film material disposed adjacent to or on an external surface of the at least one selected non-imaging pixel, wherein when the film material portion is heated, at least one optical property of the respective film material portion changes causing the heated film material portion to at least partially block light from entering the selected non-imaging pixel, and wherein the at least partial blockage of light causes the at least one programmed non-imaging pixel to output a voltage level when read by read circuitry of the image sensor device, wherein the voltage level represents said one or more digital bits stored in the at least one selected non-imaging pixel.

14. The method of claim 12, wherein the image sensor device comprises a plurality of non-imaging pixels, at least one of said plurality of non-imaging pixels corresponding to said at least one selected non-imaging pixel, said plurality of non-imaging pixels being dummy pixels that surround the imaging array and provide a buffer region for the imaging array.

* * * * *